United States Patent
Chang et al.

(10) Patent No.: US 10,283,641 B2
(45) Date of Patent: *May 7, 2019

(54) CONTACT STRUCTURES, FINFET DEVICES AND METHODS OF FORMING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/043,111

(22) Filed: Jul. 23, 2018

(65) Prior Publication Data

US 2018/0350970 A1 Dec. 6, 2018

Related U.S. Application Data

(63) Continuation of application No. 14/990,797, filed on Jan. 8, 2016, now Pat. No. 10,032,913.

(51) Int. Cl.
| | |
|---|---|
| *H01L 29/66* | (2006.01) |
| *H01L 29/78* | (2006.01) |
| *H01L 21/308* | (2006.01) |
| *H01L 23/535* | (2006.01) |
| *H01L 29/417* | (2006.01) |

(52) U.S. Cl.
CPC ........ *H01L 29/785* (2013.01); *H01L 21/3085* (2013.01); *H01L 23/535* (2013.01); *H01L 29/41791* (2013.01); *H01L 29/6656* (2013.01); *H01L 29/66795* (2013.01)

(58) Field of Classification Search
CPC ............. H01L 29/42368; H01L 29/785; H01L 29/41791; H01L 29/6656; H01L 29/66795; H01L 27/0924; H01L 21/28123; H01L 21/3085; H01L 23/535
USPC ..... 257/368, 401, 288, 77, E29.104, E27.06, 257/E21.409, E21.585; 438/163, 268, 438/300, 586, 592
See application file for complete search history.

(56) References Cited

U.S. PATENT DOCUMENTS

| | | | |
|---|---|---|---|
| 8,524,592 B1 * | 9/2013 | Xie | H01L 29/78 257/387 |
| 10,032,913 B2 * | 7/2018 | Chang | H01L 21/3085 |
| 2015/0214319 A1 * | 7/2015 | Li | H01L 29/4966 257/288 |

(Continued)

*Primary Examiner* — Dao H Nguyen
(74) *Attorney, Agent, or Firm* — JCIPRNET

(57) ABSTRACT

Contact structures, FinFET devices and methods of forming the same are disclosed. One of the contact structures includes a source/drain region, a mask layer, a connector and a shielding pattern. The source/drain region is between two gate stacks. A mask layer is over the gate stacks and has an opening corresponding to the source/drain region. The connector is electrically connected to the source/drain region, penetrates through the opening of the mask layer and protrudes above and below the mask layer. The shielding pattern is between the mask layer and the connector and in physical contact with the mask layer.

20 Claims, 9 Drawing Sheets

(56) References Cited

U.S. PATENT DOCUMENTS

| 2015/0318178 | A1* | 11/2015 | Pham | H01L 21/28 |
| | | | | 257/288 |
| 2015/0380305 | A1* | 12/2015 | Basker | H01L 21/76846 |
| | | | | 257/77 |
| 2016/0141417 | A1* | 5/2016 | Park | H01L 29/66545 |
| | | | | 257/365 |

* cited by examiner

CONTACT STRUCTURES, FINFET DEVICES AND METHODS OF FORMING THE SAME

CROSS-REFERENCE TO RELATED APPLICATION

This application is a continuation application of and claims the priority benefit of a prior application Ser. No. 14/990,797, filed on Jan. 8, 2016. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
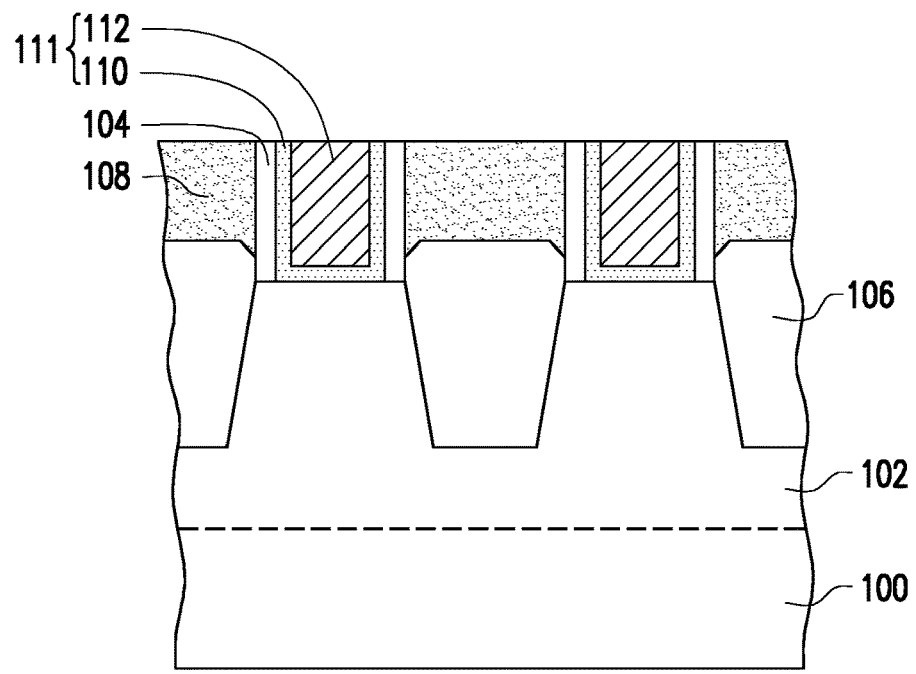
FIG. 1A to FIG. 1E are schematic cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic cross-sectional views of a method of forming a FinFET device in accordance with some embodiments.

Referring to FIG. 1A, a substrate 100 with one or more fins 102 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

In some embodiments, the substrate 100 has at least two gate stacks 111 formed thereon, spacers 104 formed on the sidewalls of the gate stacks 111, source/drain regions 106 formed therein, and a first dielectric layer 108 formed aside the gate stacks 111 and over the source/drain regions 106.

In some embodiments, the method of forming the intermediate structure of FIG. 1A includes forming two dummy gate stacks across the fins 102, forming spacers 104 on the sidewalls of the dummy gate stacks, forming source/drain regions 106 at two sides of each fin 102, forming a first dielectric layer 108 aside the dummy gate stacks and over the source/drain regions 106, and replacing the dummy gate stacks with gate stacks 111.

In alternative embodiments, the method of forming the intermediate structure of FIG. 1A includes forming at least two gate stacks 111 across the fins 102, forming spacers 104 on the sidewalls of the gate stacks 111, forming source/drain regions 106 at two sides of each fin 102, and forming a first dielectric layer 108 aside the gate stacks 111 and over the source/drain regions 106.

In some embodiments, each of the gate stacks 111 includes a gate dielectric layer 110 and a gate 112 on the gate dielectric layer 110. In some embodiments, the gate stacks 111 extend in a direction different from (e.g., perpendicular to) the extending direction of the fins 102.

In some embodiments, the gates 112 includes metal-containing gates or replacement gates. The metal-containing gates include metal, such as TiN, TaC, TaN, TaSiN, HfN, $ZrSi_2$, $MoSi_2$, $TaSi_2$, $NiSi_2$, WN or the like. When the device of the disclosure is an N-type FinFET device, the gates 112 include an N-type work function metal material. When the device of the disclosure is a P-type FinFET device, the gates 112 include a P-type work function metal material. In alternative embodiments, the gates 112 are silicon-containing gates. The silicon-containing gates include amorphous silicon, polysilicon or a combination thereof.

In some embodiments, each of the gate dielectric layers 110 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric layer 110 can optionally include a silicate such as HfSiO, LaSiO, AlSiO, a combination thereof, or a suitable material.

In some embodiments, each of the gate dielectric layers 110 surrounds the sidewall and bottom of the corresponding gate 112 and on the top and sidewall of each fin 102, as shown in FIG. 1A. In alternative embodiments, each of the gate dielectric layers 110 is formed merely between the bottom of the corresponding gate 112 and the substrate 100. In some embodiments, an interfacial layer such as a silicon oxide layer is formed between the gate dielectric layer 110 and each fin 102.

In some embodiments, the spacers 104 include a nitrogen-containing dielectric material, a carbon-containing dielectric material or both, and the spacers 104 have a dielectric constant less than about 10, or even less than about 5. In some embodiments, the spacers 104 includes SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 104 includes forming a spacer material layer on the substrate 100, and partially removing the spacer material layer by an anisotropic etching process.

In some embodiments, two source/drain regions 106 are formed beside each of the gate stack 111, and one of the source/drain regions 106 is between the adjacent gate stacks 111. In some embodiments, the source/drain regions 106 include silicon germanium (SiGe) for a P-type FinFET device. In alternative embodiments, the source/drain regions 106 include silicon carbon (SiC), silicon phosphate (SiP), SiCP or a SiC/SiP multi-layer structure for an N-type FinFET device. In some embodiments, the source/drain regions 106 may be optionally implanted with an N-type dopant or a P-type dopant as needed. In some embodiments, the adjacent source/drain regions 106 at the same side are separate from each other. In alternative embodiments, the adjacent source/drain regions 106 at the same side are connected with one another. Following the formation of the source/drain regions 106, silicide regions may be formed by siliciding the top portions of the source/drain regions 106.

In some embodiments, the first dielectric layer 108 includes nitride such as silicon nitride, oxide such as silicon oxide, phosphosilicate glass (PSG), borosilicate glass (BSG), boron-doped phosphosilicate glass (BPSG), a combination thereof or the like. In some embodiments, the top surface of the first dielectric layer 108 is substantially level with the top surfaces of the gates 112. In some embodiments, a contact etch stop layer (CESL) is formed after the step of forming the source/drain regions 106 and before the step of forming the first dielectric layer 108, and the CESL includes SiN, SiC or the like.

Figure 1B:
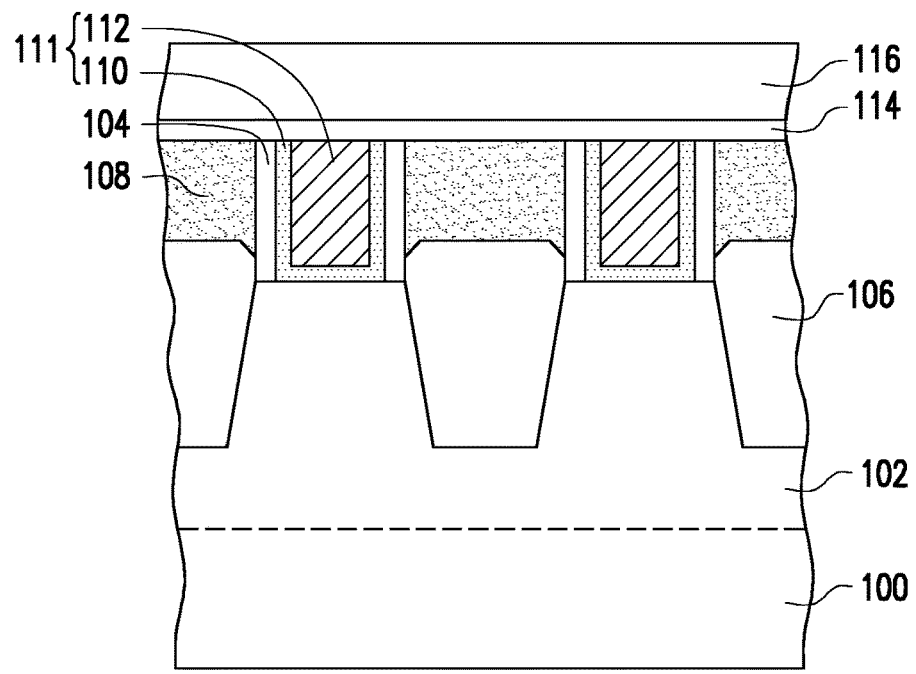

Referring to FIG. 1B, a mask layer 114 is formed over the gate stacks 111. In some embodiments, the mask layer 114 is configured to protect the gates 112 from being damaged during the following contact hole defining step. In some embodiments, the mask layer 114 serves as a gate protection layer, so the conventional cap layer or hard mask layer is not included in each of the gate stacks 111. In some embodiments, the mask layer 114 is blanket-formed on the gate stacks 111 and the first dielectric layer 108. Specifically, the mask layer 114 is formed in physical contact with the gates 112, the spacers 104 and the first dielectric layer 108. In some embodiments, the mask layer 114 is in physical contact with the gate dielectric layers 110, as shown in FIG. 1B. In alternative embodiments, the mask layer 114 is not in physical contact with the gate dielectric layers 110. In some embodiments, the mask layer 114 includes SiN, SiC, SiCN, SiON, SiCON, a combination thereof or the like, and is formed by a suitable deposition technique such as chemical vapor deposition (CVD), plasma-enhanced CVD (PECVD), atomic layer deposition (ALD), remote plasma ALD (RPALD), plasma-enhanced ALD (PEALD), a combination thereof or the like. In some embodiments, the mask layer 114 has a thickness of about 5 angstroms to 100 angstroms.

Thereafter, a second dielectric layer 116 is formed over the mask layer 114. In some embodiments, the second dielectric layer 116 is blanket-formed on the mask layer 114. In some embodiments, the second dielectric layer 116 includes a material the same as that of the first dielectric layer 108. In alternative embodiments, the second dielectric layer 116 and the first dielectric layer 108 are made by different materials. In some embodiments, the second dielectric layer 116 includes nitride such as silicon nitride, oxide such as silicon oxide, PSG, BSG, BPSG, a combination thereof or the like, and is formed by a suitable deposition technique such as spin-coating, CVD, flowable CVD, PECVD, ALD, a combination thereof or the like.

Figure 1C:
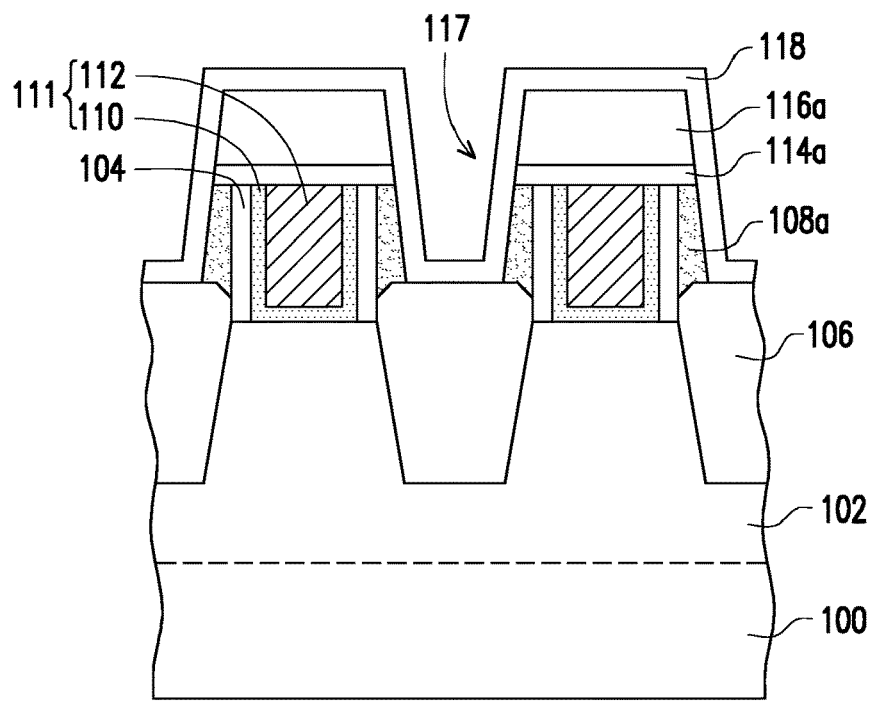

Referring to FIG. 1C, the second dielectric layer 116, the mask layer 114 and the first dielectric layer 108 are patterned or partially removed to form openings 117 (or called "contact holes") corresponding to the source/drain regions 106, respectively. In some embodiments, the patterning step includes performing an etching process. In some embodiments, each of the openings 117 penetrates through the second dielectric layer 116, the mask layer 114 and the first dielectric layer 108 and exposes the corresponding source/drain region 106. Herein, the patterned second dielectric layer, the patterned mask layer and the patterned first dielectric layer are respectively referred to as a second dielectric layer 116a, a mask layer 114a and a first dielectric layer 108a. In some embodiments, the openings 117 have tilted sidewalls, as shown in FIG. 1C. In alternative embodiments, at least some of the openings 117 have substantially vertical sidewalls. In some embodiments, the aspect ratio of the openings 117 is greater than about 3, greater than about 10, greater than about 15 or even greater than about 20. In some embodiments, the openings 117 have substantially the same size. In alternative embodiments, the sizes of the openings 117 are varied. Besides, the shape of the openings 117 can be circular, oval, square, rectangular, strip, polygonal or any shape as needed.

In some embodiments, after the second dielectric layer 116 is formed, a hard mask layer with multiple openings is formed on the second dielectric layer 116. In some embodiments, the openings of the hard mask layer correspond to the intended locations of the subsequently formed contact holes. In some embodiments, the hard mask layer includes a photoresist material, a dielectric material or a combination thereof, and is formed by a CVD, ALD, spin coating, a combination thereof or the like. Thereafter, portions of the second dielectric layer 116, the mask layer 114 and the first dielectric layer 108 are removed by using the hard mask layer as an etch mask.

From another point of view, upon the patterning step of FIG. 1C, each of the second dielectric layer 116a and the mask layer 114a is formed with a mesh structure having multiple openings 117 or mesh holes therein, and the first dielectric layer 108a is formed around the gate stacks 111 and covers portions of the source/drain regions 106.

Continue referring to FIG. 1C, a shielding layer 118 is conformally formed on the sidewalls and bottoms of the openings 117. Specifically, the shielding layer 118 is formed over the second dielectric layer 116a along the surfaces of the openings 117. In some embodiments, the shielding layer 118 is formed in physical contact with the second dielectric layer 116a, the mask layer 114a, the first dielectric layer 108a and the source/drain regions 106. In some embodiments, the shielding layer 118 includes a material the same as that of the mask layer 114a. In alternative embodiments, the shielding layer 118 and the mask layer 114a are made by different materials. In some embodiments, the shielding layer 118 includes SiN, SiC, SiCN, SiON, SiCON, a combination thereof or the like, and is formed by a suitable deposition technique such as CVD, PECVD, ALD, RPALD, PEALD, a combination thereof or the like. In some embodiments, the shielding layer 118 has a thickness of about 5 angstroms to 100 angstroms.

Figure 1D:
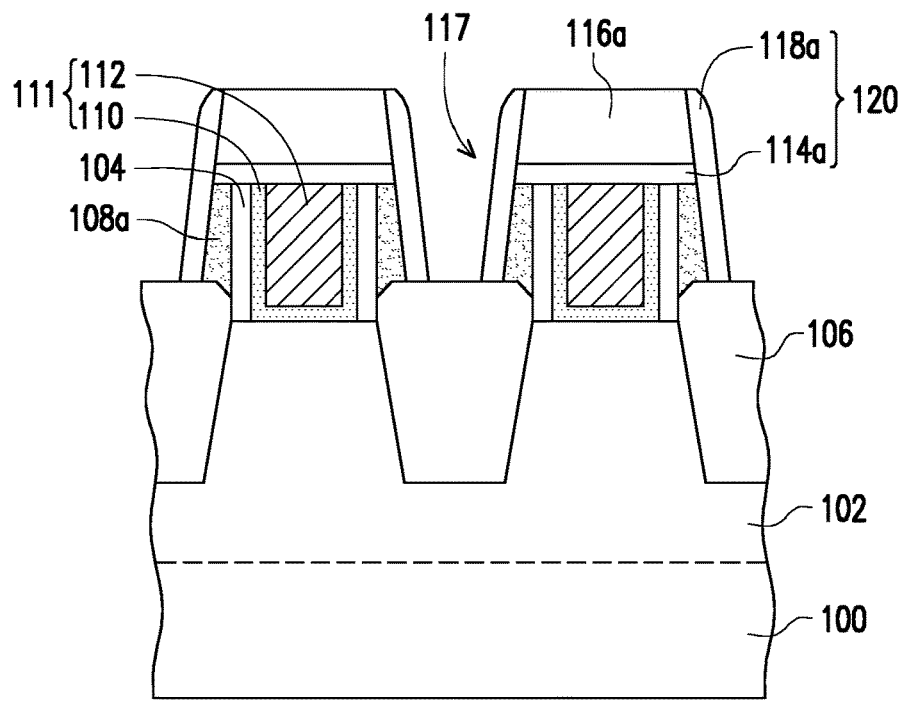

Referring to FIG. 1D, the shielding layer 118 is partially removed to form shielding patterns 118a respectively in the openings 117. In some embodiments, a portion of the shielding layer 118 is removed by an anisotropic etching process, and the remaining shielding layer forms the shielding patterns 118a, each of which is in a spacer form, along the sidewalls of the openings 117 respectively. Herein, the shielding patterns 118 are sometimes referred to as shielding spacers through the specification. In some embodiments, from another point of view, each of the shielding patterns 118a is formed in a ring shape and exposes the corresponding source/drain region 106.

Figure 1E:
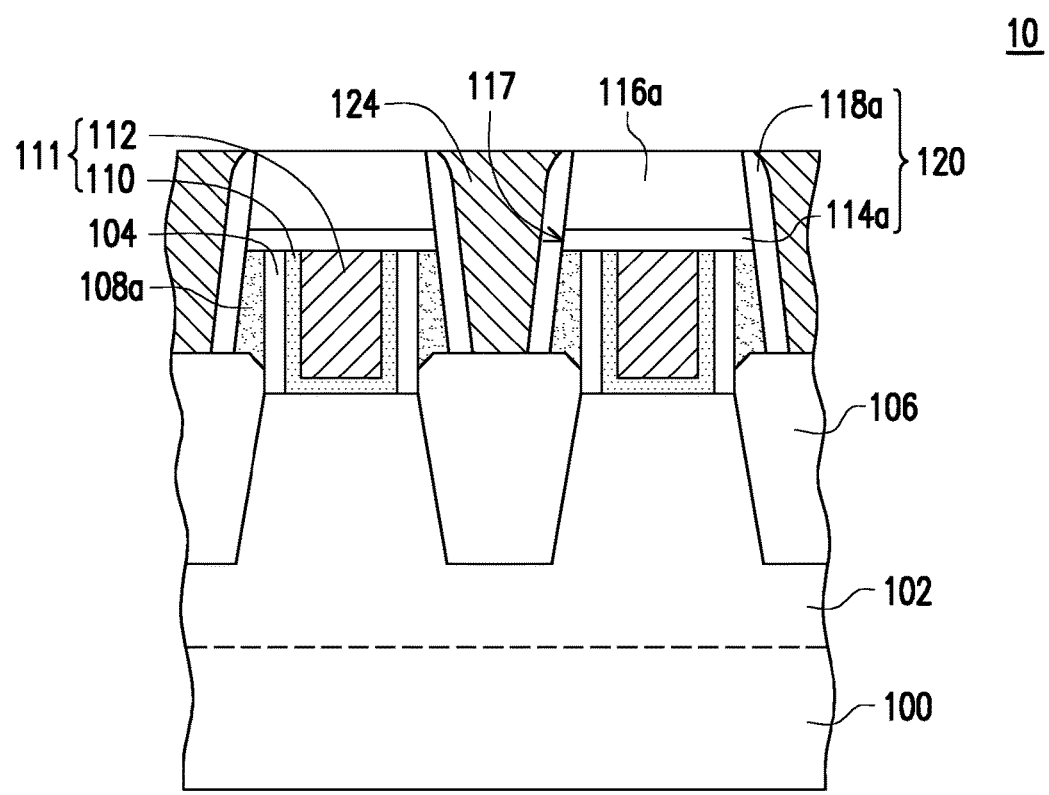

Referring to FIG. 1E, connectors 124 are formed in the openings 117. In some embodiments, the connectors 124 are intended to represent any type of conductive materials and structures that are electrically connected to the source/drain regions 106. In some embodiments, the connectors 124 include metal, such as tungsten, copper, an alloy thereof or any metal material with suitable resistance and gap-fill capability. In some embodiments, after the shielding patterns 118a are formed, a metal material layer is formed on the substrate 100 filling in the openings 117. The metal material layer is formed by sputtering, CVD, electrochemical plating (ECP), a combination thereof or the like. A planarization step such as CMP is then performed to remove a portion of the metal material layer until the top of the second dielectric layer 116a is exposed. In some embodiments, the tops of the connectors 124 are substantially coplanar with the top of the second dielectric layer 116a. A FinFET device 10 is thus completed.

In some embodiments, each connector 124 stacks on the corresponding source/drain region 106 while a shielding pattern 118a surrounds the connector 124 and is located between the connector 124 and each of the adjacent gate stacks 111. Besides, the shielding patterns 118a and the mask layer 114a are in contact with each other and form a protection structure 120 together, so as to prevent the connectors 124 from contacting the gates 112 of the gate stacks 111. In other words, the connectors 124 and the gates 112 are isolated from each other by the protection structure 120 of the disclosure, so as to prevent unwanted electrical connection between the connectors 124 and the gates 112. By such manner, the process window of fabricating the connectors 124 is widened and the reliability of the device is accordingly improved.

Figure 2:
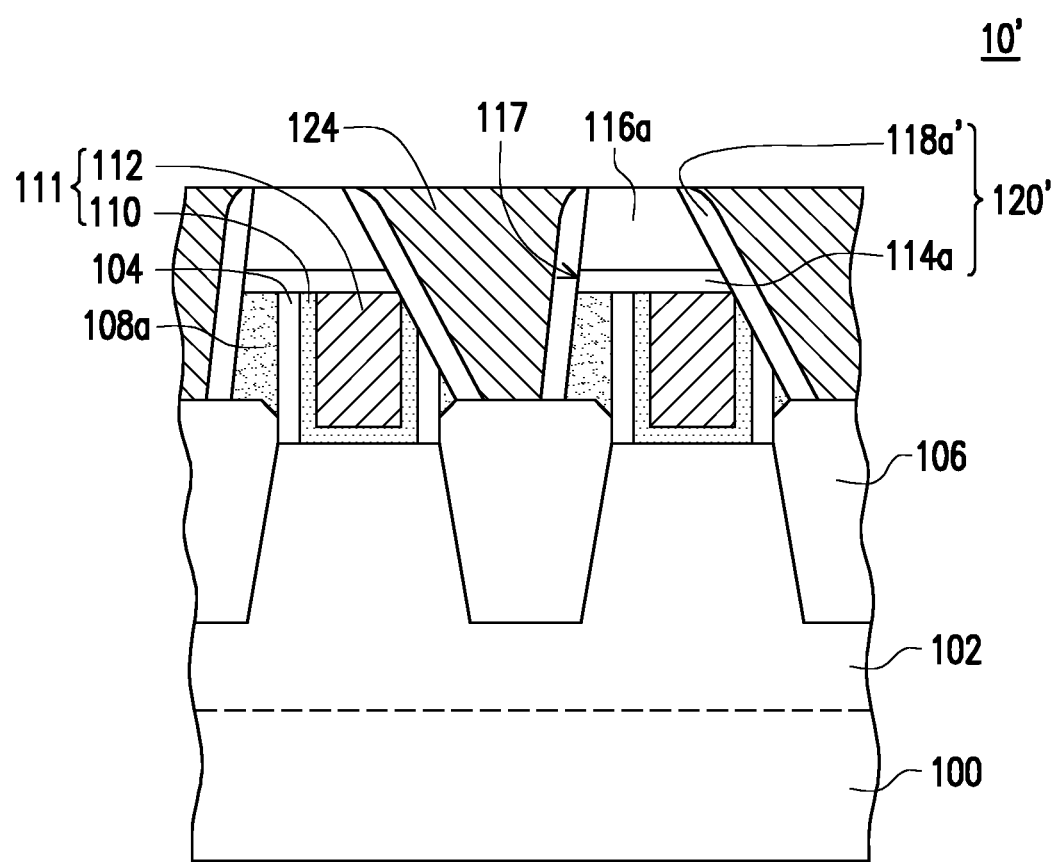
FIG. 2 is a schematic cross-sectional view of a FinFET device in accordance with some embodiments.

Specifically, due to the high aspect ratio of the openings 117 or contact holes, the process window for the contact hole defining step is rather small. In some embodiments, when over-etching and/or misalignment occurs, the locations of the openings 117 are shifted and/or the shapes of the openings 117 are deformed, and thus, portions or corners of the gates 112 are exposed, as shown in FIG. 2. However, a short between the connectors 124 and the gates 112 is not observed in the disclosure. Specifically, the mask layer 114a covers the tops of the gates 112 and the shielding patterns 118b' cover the exposed corners of the gates 112, so the connectors 124 are fully isolated from the gates 112.

The above embodiments in which the shielding patterns 118a cover the entire sidewalls of the openings 117 are provided for illustration purposes, and are not construed as limiting the present disclosure.

FIG. 3A to FIG. 3E are schematic cross-sectional views of a method of forming a FinFET device in accordance with alternative embodiments. The method of FIG. 1A to FIG. 1E is similar to the method of FIG. 3A to FIG. 3E, and the difference between them lies in that in the latter method, the shielding patterns 118b are formed to merely cover portions of the sidewalls of the openings 117. The difference between them is described in the following, and the similarity is not iterated herein.

Figure 3A:
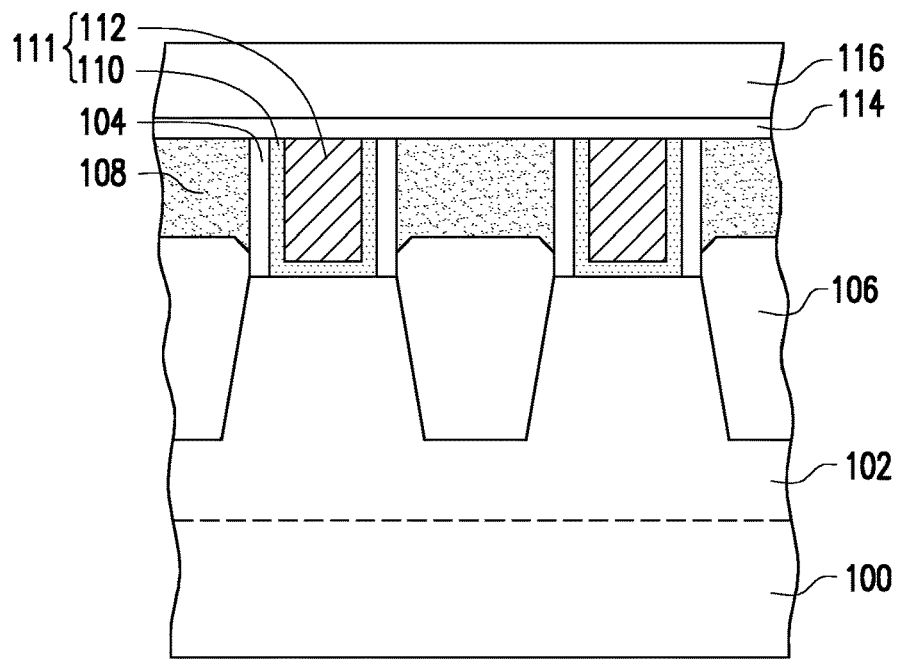
FIG. 3A to FIG. 3E are schematic cross-sectional views of a method of forming a FinFET device in accordance with alternative embodiments.
Figure 3B:
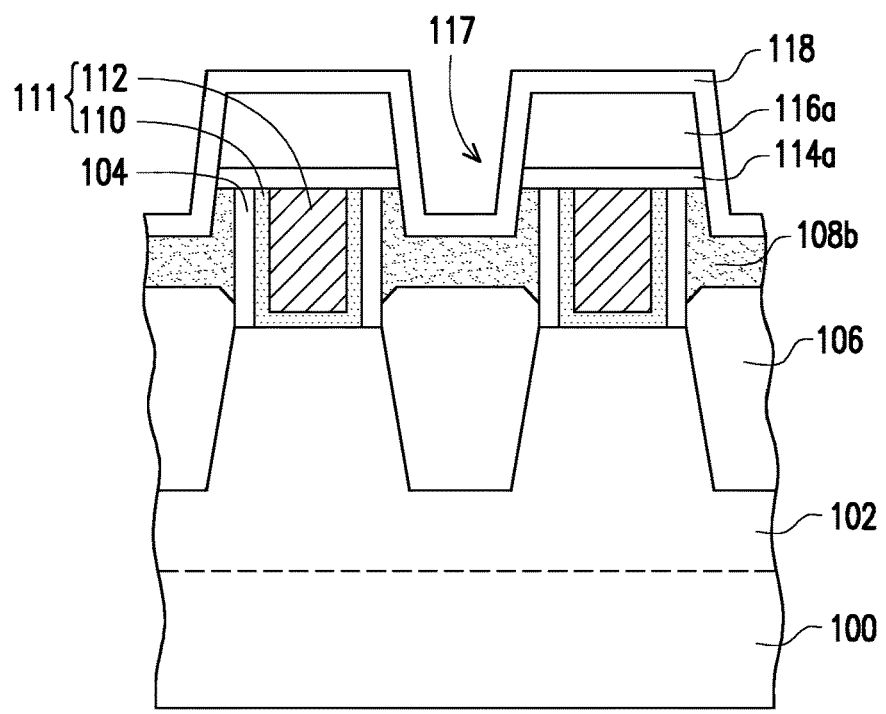

Referring to FIG. 3A, an intermediate structure of FIG. 1B is provided. Thereafter, the second dielectric layer 116, the mask layer 114 and the first dielectric layer 108 are patterned or partially removed to form openings 117 corresponding to the source/drain regions 106 respectively, as shown in FIG. 3B. In some embodiments, the patterning step includes performing an etching process. In some embodiments, each of the openings 117 penetrates through the second dielectric layer 116 and the mask layer 114 and exposes the first dielectric layer 108. In some embodiments, each of the openings 117 further extends to a portion of the first dielectric layer 108. Herein, the patterned second dielectric layer, the patterned mask layer and the patterned first dielectric layer are respectively referred to as a second dielectric layer 116a, a mask layer 114a and a first dielectric layer 108b.

Continue referring to FIG. 3B, a shielding layer 118 is conformally formed on the sidewalls and bottoms of the openings 117. In some embodiments, the shielding layer 118 is formed in physical contact with the second dielectric layer 116a, the mask layer 114a and the first dielectric layer 108b but not in contact with the source/drain regions 106.

Figure 3C:
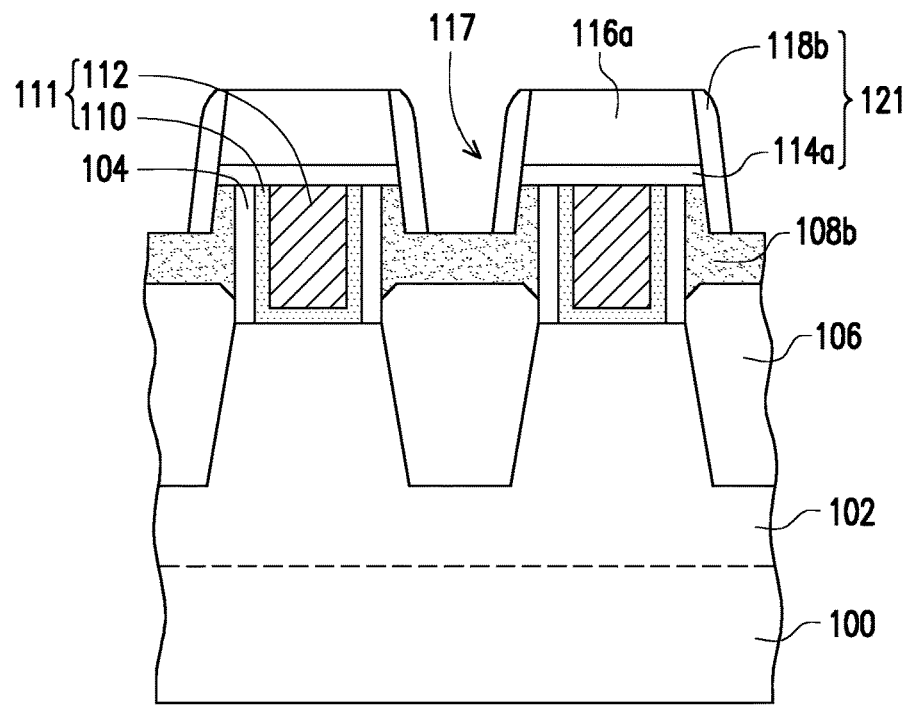

Referring to FIG. 3C, the shielding layer 118 is partially removed to form shielding patterns 118b respectively in the openings 117. In some embodiments, a portion of the shielding layer 118 is removed by an anisotropic etching process, and the remaining shielding layer forms the shielding patterns 118b as spacers on the sidewalls of the openings 117, respectively. In some embodiments, from another point of view, each of the shielding patterns 118b is formed in a ring shape and exposes a portion of the first dielectric layer 108b.

Figure 3D:
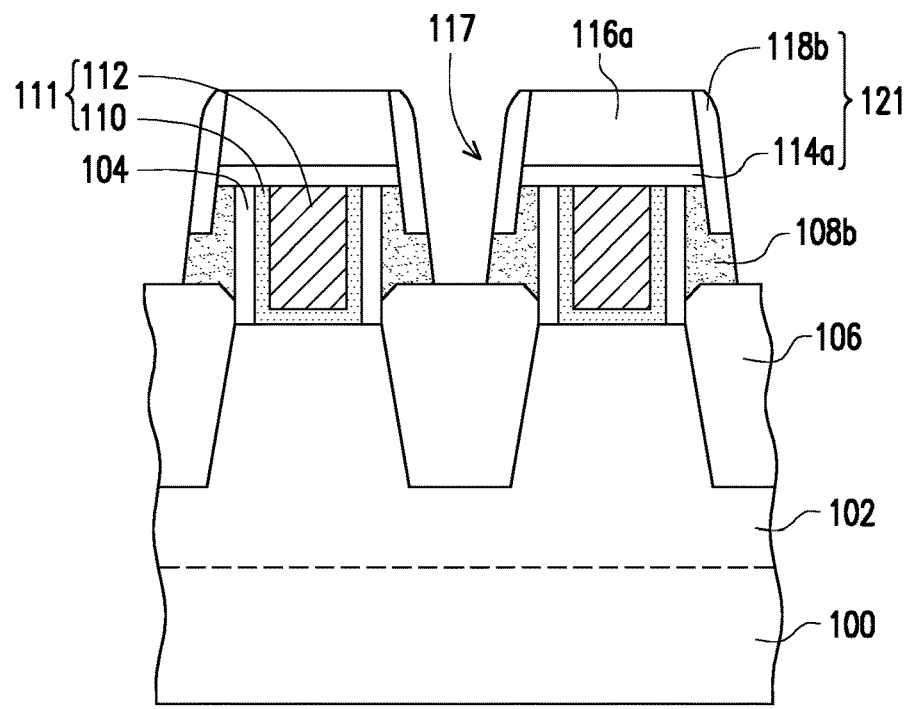

Referring to FIG. 3D, the openings 117 are deepened by using the shielding patterns 118b and the second dielectric layer 116a as an etch mask, until the openings 117 exposes the source/drain regions 106. The deepening step is referred to as a self-aligned etching process.

In some embodiments, a multi-step etching process (e.g., the steps in FIG. 3C to FIG. 3D) is conducted to form contact openings, and such multi-step etching process is beneficial to form high-aspect-ratio openings with better etching control, and therefore improved opening profiles are obtained.

Figure 3E:
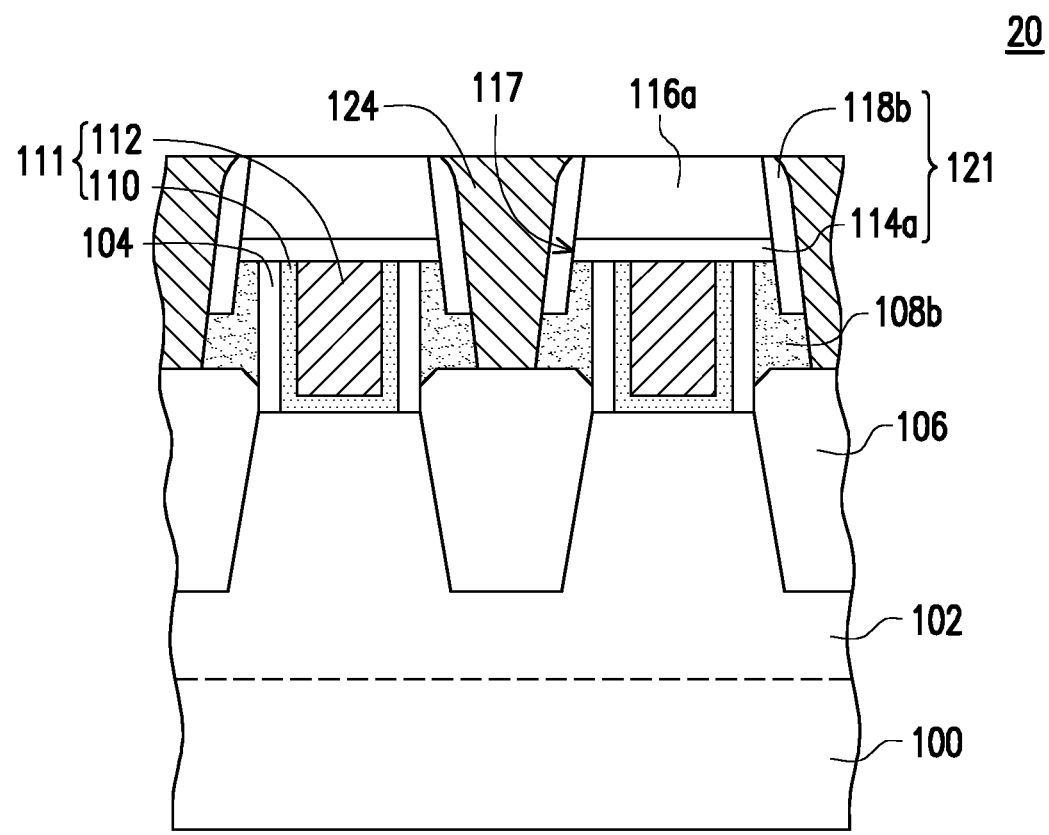

Referring to FIG. 3E, connectors 124 are formed in the openings 117 and electrically connected to the source/drain regions 106. A FinFET device 20 is thus completed.

Figure 4:
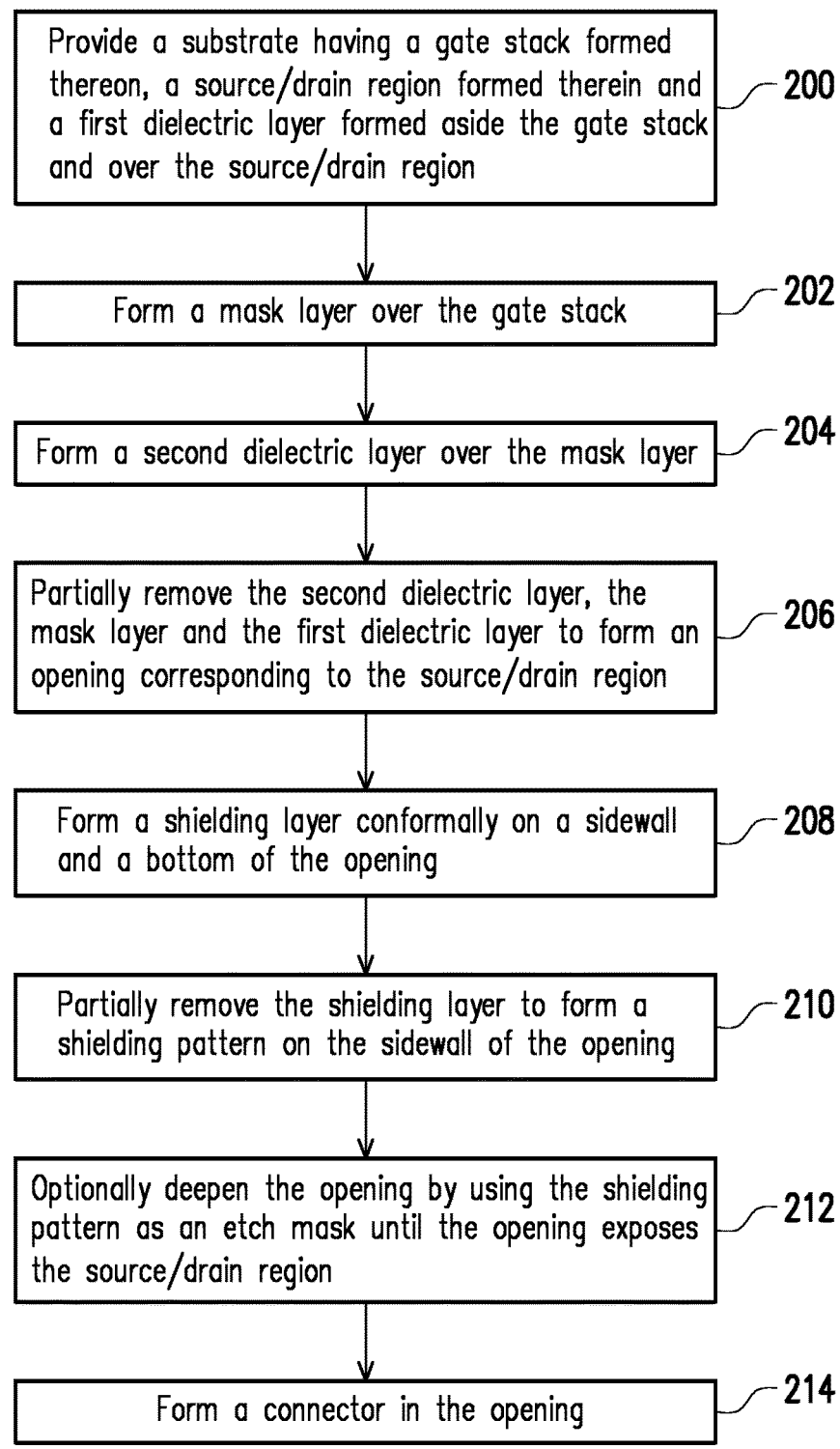
FIG. 4 is a flow chart of a method of forming a FinFET device in accordance with some embodiments.

The above-mentioned process steps in FIG. 1A-1E and FIG. 3A-3E can be concisely illustrated with reference to the flow chart of FIG. 4.

At step 200, a substrate 100 is provided with a gate stack 111 formed thereon, a source/drain region 106 formed therein and a first dielectric layer 108 formed aside the gate stack 111 and over the source/drain region 106, as shown in FIG. 1A and FIG. 3A. At step 202, a mask layer 114 is formed over the gate stack 111, as shown in FIG. 1B and FIG. 3A. At step 204, a second dielectric layer 116 is formed over the mask layer 114, as shown in FIG. 1B and FIG. 3A. At step 206, the second dielectric layer 116, the mask layer 114 and the first dielectric layer 108 are partially removed to form an opening 117 corresponding to the source/drain region 106, as shown in FIG. 1C and FIG. 3B. In some embodiments, the formed opening 117 of FIG. 1C penetrates through the second dielectric layer 116, the mask layer 114 and the first dielectric layer 108 and exposes the source/drain region 106. In alternative embodiments, the formed opening 117 of FIG. 3B penetrates through the second dielectric layer 116 and the mask layer 114 and extends to a portion of the first dielectric layer 108b. At step 208, a shielding layer 118 is conformally formed on the sidewall and the bottom of the opening 117, as shown in FIG. 1C and FIG. 3B. At step 210, the shielding layer 118 is partially removed to form a shielding pattern 118a/118b on the sidewall of the opening 117, as shown in FIG. 1D and FIG. 3C. At step 212, the opening 117 is optionally deepened by using the shielding pattern 118b as an etch mask until the opening 117 exposes the source/drain region 106, as shown in FIG. 3D. At step 214, a connector 124 is formed in the opening 117, as shown in FIG. 1E and FIG. 3E.

The structures of the FinFET devices of the disclosure are described with reference to FIG. 1E, FIG. 2, FIG. 3E, FIG. 5 and FIG. 6.

In some embodiments, the FinFET device 10/10'/20 includes a substrate 100, at least two gate stacks 111, spacers 104, a source/drain region 106, a first dielectric layer 108a/108b and a connector 124. The substrate 100 has at least one fin 102. Each of the gate stacks 111 includes a gate 112 and is across the at least one fin 102. The source/drain region 106 is aside the gate stacks 111. In some embodiments, the source/drain region 106 is in the substrate 100 between the gate stacks 111. The connector 124 is over the source/drain region 106. The spacers 104 are on the sidewalls of the gate stacks 111, and each of the spacers 104 is between the connector 124 and the corresponding gate stack 111. The first dielectric layer 108a/108b is between the connector 124 and the spacers 104.

It is noted that in the disclosure, a protection structure 120/120'/121 is further included in the FinFET device 10/10'/20 and includes a mask layer 114a and a shielding pattern 118a/118a'/118b in contact with each other.

Figure 5:
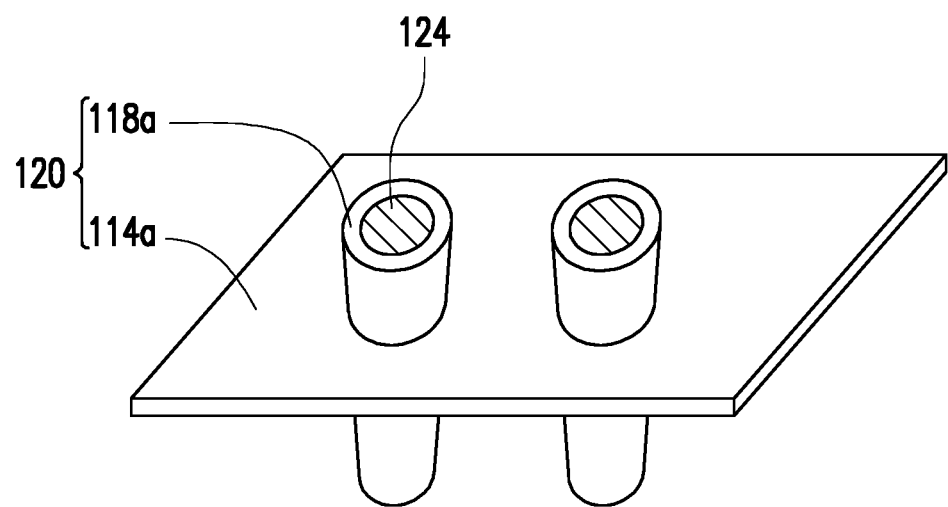
FIG. 5 is a partial perspective view of a FinFET device in accordance with some embodiments.
Figure 6:
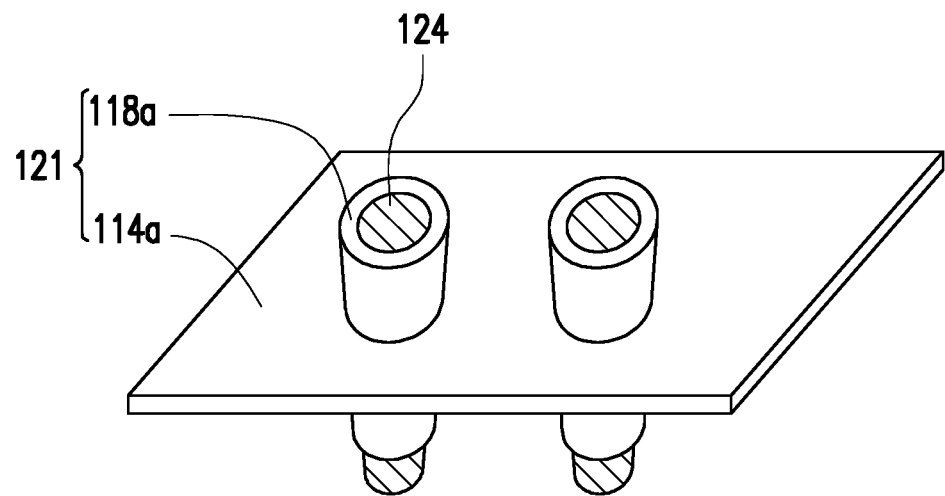
FIG. 6 is a partial perspective view of a FinFET device in accordance with alternative embodiments.

The shielding pattern 118a/118a'/118b surrounds at least a portion of the sidewall of the connector 124. In some embodiments, the shielding pattern 118a/118a' surrounds the entire sidewall of the connector 124, as shown in FIG. 1E, FIG. 2, and FIG. 5. Specifically, the shielding pattern 18a/118a' is in physical contact with the source/drain region 106. In alternative embodiments, the shielding pattern 118b surrounds the upper sidewall of the connector 124, as shown in FIG. 3E and FIG. 6. Specifically, the shielding pattern 118b is not in physical contact with the source/drain region 106. In some embodiments, the shielding pattern 118a is fully isolated from the gates 112 of the gate stacks 111, as shown in FIG. 1E and FIG. 3E. In alternative embodiments, the shielding pattern 118a' is in physical contact with the gate 112 of at least one of the gate stacks 111, as shown in FIG. 2.

The mask layer 114a extends from the middle or waist of the shielding pattern 118a/118a'/118b. In some embodiments, the middle of the shielding pattern 118a/118a'/118b indicates a portion between the top and the bottom of the shielding pattern 118a/118a'/118b. In some embodiments, the mask layer 114a outwardly extends in a horizontal direction from the middle of the shielding pattern 118a/118a'/118b. Besides, the mask layer 114a is in physical contact with the gates 112 of the gate stacks 111. In some embodiments, the mask layer 114a covers not only tops of the gates 112 but also tops of the spacers 104 and/or the top of the first dielectric layer 108a/108b.

In some embodiments, each of the mask layer 114a and the shielding pattern 118a/118a'/118b includes SiN, SiC, SiCN, SiON, SiCON or a combination thereof. In some embodiment, the mask layer 114a and the shielding pattern 118a/118a'/118b include the same material. In some embodiments, each of the mask layer 114a and the shielding pattern 118a/118a'/118b includes a material having an etching rate different from that of the first dielectric layer 108a/108b or the second dielectric layer 116a.

In some embodiments, the first dielectric layer 108a/108b is between the shielding pattern 118a/118b and the spacers 104. In some embodiments, the first dielectric layer 108a surrounds the sidewall of the shielding pattern 118a, as shown in FIG. 1E. In alternative embodiments, the first dielectric layer 108b surrounds not only the sidewall but also the bottom of the shielding pattern 118b, as shown in FIG. 3E.

In some embodiments, a second dielectric layer 116a is further included in the FinFET device 10/10'/20, and the second dielectric layer 116a is over the mask layer 114a and surrounds the upper sidewall of the shielding pattern 118a/118a'.

In some embodiments, a contact structure of a FinFET device 10/10'/20 includes a source/drain region 106, a mask layer 114a, a connector 124 and a shielding pattern 118a/118a'/118b. The source/drain region 106 is between two gate stacks 111. The mask layer 114a is over the gate stacks 111 and has an opening 117 corresponding to the source/drain region 106. The connector 124 is electrically connected to the source/drain region 106, penetrates through the opening 117 of the mask layer 114a and protrudes above and below the mask layer 114a. In some embodiments, when the mask layer 114a is provided with a mesh structure having multiple separate openings 117 therein, multiple connectors 124 are formed to respectively penetrate through the openings 117. The shielding pattern 118a/118a'/118b is between and in contact with the mask layer 114a and the connector 124.

In the above embodiments, the contact structure of the disclosure is applied to a FinFET device. However, the disclosure is not limited thereto. In alternative embodiments, the contact structure of the disclosure can be applied to a planar device upon the process requirements.

The above embodiments in which each of the gate dielectric layers, the gates, the spacers, the first dielectric layer, the mask layer, the second dielectric layer, the shielding patterns and the connectors is a single layer are provided for illustration purposes, and are not construed as limiting the present disclosure. In some embodiments, at least one of these described elements can be a multi-layer structure as needed.

In view of the above, in some embodiments, a strong protection structure is provided around a contact structure, so as to prevent unwanted electrical connection between the contact structure and the adjacent gate. Specifically, the protection structure of the disclosure includes a shielding pattern between a connector and an adjacent gate and a mask layer over the adjacent gate and in contact with the shielding pattern. By such disposition, wider lithography/etching process window, less lithography overlay requirement, better channel isolation, and greater contact-to-gate distance are gained. Therefore, the conventional metal gate damage is not observed, and the performance and reliability of the device are accordingly improved.

In accordance with some embodiments of the present disclosure, a contact structure of a FinFET device includes a source/drain region, a mask layer, a connector and a shielding pattern. The source/drain region is between two gate stacks. A mask layer is over the gate stacks and has an opening corresponding to the source/drain region. The connector is electrically connected to the source/drain region, penetrates through the opening of the mask layer and protrudes above and below the mask layer. The shielding pattern is between the mask layer and the connector and in contact with the mask layer.

In accordance with alternative embodiments of the present disclosure, a FinFET device includes a substrate, a gate stack, a source/drain region, a connector, a shielding pattern and a mask layer. The substrate has at least one fin. The gate stack includes a gate and is across the at least one fin. The source/drain region is aside the gate stack. The connector is over the source/drain region. The shielding pattern surrounds at least a portion of a sidewall of the connector. The mask layer extends from a middle of the shielding pattern and is in physical contact with the gate.

In accordance with yet alternative embodiments of the present disclosure a method of forming a FinFET device including the following steps. A substrate is provided with a gate stack formed thereon and a source/drain region formed therein and a first dielectric layer formed aside the gate stack and over the source/drain region. A mask layer is formed over the gate stack. A second dielectric layer is formed over the mask layer. The second dielectric layer, the mask layer and the first dielectric layer are partially removed to form an opening corresponding to the source/drain region. A shielding layer is conformally formed on a sidewall and a bottom of the opening. The shielding layer is partially removed to form a shielding pattern on the sidewall of the opening. A connector is formed in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A contact structure of a FinFET device, comprising:
    a source/drain region between two gate stacks;
    a mask layer over the gate stacks;
    a connector electrically connected to the source/drain region, penetrating through the mask layer and protruding above and below the mask layer; and
    a shielding pattern between the mask layer and the connector and surrounding the connector,
    wherein the shielding pattern is in contact with a spacer on one of the gate stacks and is spaced apart from another spacer on the other of the gate stacks.

2. The contact structure of claim 1, wherein the shielding pattern surrounds an upper sidewall of the connector.

3. The contact structure of claim 1, wherein the shielding pattern surrounds an entire sidewall of the connector.

4. The contact structure of claim 1, wherein the mask layer and the shielding pattern comprise SiN, SiC, SiCN, SiON, SiCON or a combination thereof.

5. The contact structure of claim 1, wherein the mask layer is substantially as thick as the shielding pattern.

6. The contact structure of claim 1, wherein the mask layer and the shielding pattern comprise the same material.

7. The contact structure of claim 1, wherein the mask layer is in physical contact with gates of the gate stacks.

8. The contact structure of claim 1, wherein the shielding pattern is in physical contact with a gate of one of the gate stacks.

9. The contact structure of claim 1, wherein a top thickness is less than a bottom thickness of the shielding pattern.

10. A FinFET device, comprising:
    a substrate having at least one fin;
    a gate stack comprising a gate across the at least one fin;
    a source/drain region aside the gate stack;
    a connector over the source/drain region;
    an insulating shielding pattern surrounding at least a portion of a sidewall of the connector; and
    a mask layer extending from a middle of the insulating shielding pattern and being in physical contact with the gate,
    wherein the insulating shielding pattern is in physical contact with a spacer aside the gate stack.

11. The FinFET device of claim 10, wherein the insulating shielding pattern surrounds an upper sidewall of the connector.

12. The FinFET device of claim 10, wherein the insulating shielding pattern surrounds an entire sidewall of the connector.

13. The FinFET device of claim 10, wherein the mask layer comprises SiN, SiC, SiCN, SiON, SiCON or a combination thereof.

14. FinFET device of claim 10, wherein the insulating shielding pattern comprises SiN, SiC, SiCN, SiON, SiCON or a combination thereof.

15. FinFET device of claim 10, wherein slopes of opposite sidewalls of the connector is different.

16. FinFET device of claim 10, further comprising a dielectric layer between the spacer and the insulating shielding pattern.

17. A contact structure of a semiconductor device, comprising:
    a source/drain region between two gate stacks;
    a mask layer over the gate stacks;

a connector electrically connected to the source/drain region, penetrating through the mask layer and protruding above and below the mask layer; and an insulating shielding pattern between the mask layer and the connector and extending in a direction different from that of the mask layer, wherein the insulating shielding pattern is not in physical contact with the source/drain region, and wherein the connector has a substantially smooth sidewall without a turning point.

18. The contact structure of claim 17, wherein the insulating shielding pattern surrounds an upper sidewall of the connector.

19. The contact structure of claim 17, wherein the mask layer is in physical contact with gates of the gate stacks.

20. The contact structure of claim 17, wherein the insulating shielding pattern is in physical contact with a gate of at least one of the gate stacks.

* * * * *